March 9, 1965 F. R. BEAN ETAL 3,173,103

LINEARIZER FOR FREQUENCY MODULATION GENERATOR

Filed Sept. 14, 1961 2 Sheets-Sheet 1

INVENTORS.
FRANK R. BEAN
DONALD MAWDSLEY

BY C. A. Gulbrandsen

ATTY.

LINEARIZER FOR FREQUENCY MODULATION GENERATOR

Filed Sept. 14, 1961 2 Sheets-Sheet 2

INVENTORS.
FRANK R. BEAN
DONALD MAWDSLEY

BY C. A. Gulbrandsen
Atty.

Patented Mar. 9, 1965

3,173,103

LINEARIZER FOR FREQUENCY MODULATION GENERATOR

Frank R. Bean, Rock Springs, Wyo., and Donald M. Mawdsley, Santa Clara, Calif., assignors to Lenkurt Electric Co., Inc., San Carlos, Calif., a corporation of Delaware
Filed Sept. 14, 1961, Ser. No. 138,108
4 Claims. (Cl. 331—84)

This invention relates to linearizers for frequency modulation generators and more particularly to linearizers for reflex oscillators using klystrons.

The variation of output frequency of a klystron reflex oscillator with applied modulation voltage is inherently nonlinear. However, for proper operation of such an oscillator as a frequency modulation generator having low distortion, it is desirable that this variation be linear.

Arrangements developed in the past for linearizing a klystron employ many bulky components, including either long runs of waveguide or an electronic feedback system consisting of a microwave limiter, discriminator and two wideband electronic amplifiers. The main disadvantages of these known arrangements are their bulkiness due to the complex system used and the expense of the equipment. However, one such arrangement using long pieces of waveguide, a slide screw tuner and an attenuator, may actually consume one half the usable power output of the klystron.

It is therefore an object of this invention to provide a convenient and inexpensive means for reducing distortion in frequency modulation generators.

A feature of this invention is the use of a tunable filter cavity and an adjustable quarter-wave transformer to linearize the frequency versus repeller-voltage characteristic of a klystron generator. Another feature of this invention is a method of obtaining a linearizer which is about ten times smaller in size than previous such devices.

The frequency variable impedance or admittance necessary to linearize a klystron oscillator may be determined in a number of ways one of which is (*a*) using the linearizer described in United States Patent 2,747,163 issued May 22, 1956, and the references therein listed or included, (*b*) determining the impedance or admittance presented at the klystron flange by this device and (*c*) plotting this information on a Smith Chart. The Smith Chart is a transmission line chart which is useful in graphically determining and displaying the various properties of transmission lines (see Frederick E. Terman, Electronic and Radio Engineering, Fourth Edition, McGraw-Hill, starting at page 100, and Electronics, vol. 17, No. 1, pp. 130–133, 318–325, January 1944).

Thus, for convenience the admittance characteristic presented to the klystron signal output by the device described in the above mentioned U.S. patent is plotted on a Smith Chart. According to the principles of this invention, the admittance represented by this plot may be duplicated by a short length of waveguide, a tunable filter cavity and a quarter-wave transformer. The required cavity "Q" and transformer transformation ratio may be determined from the Smith Chart. Thus, a device may be produced for linearizing the variation of output frequency with input modulation voltage which is simple, convenient, inexpensive and less than four inches long.

This invention will be more clearly understood and other embodiments will become obvious upon reference to the following description and drawings in which.

The modulation sensitivity of a klystron is determined in part by the load impedance into which it must work. Utilizing this fact, a device can be constructed that presents a particular load at a given frequency which can compensate for the nonlinear characteristic of the klystron.

Figure 6:
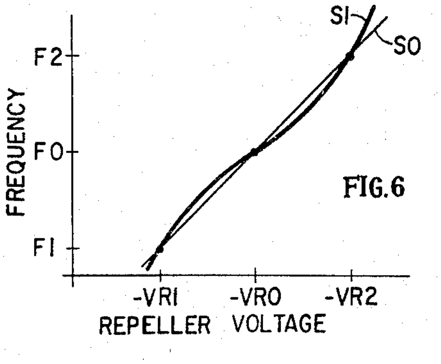

Curve $S_1$ of FIG. 6, illustrates the nonlinear characteristic of a klystron that is operating into a matched load (VSWR=1.0).

Figure 1:
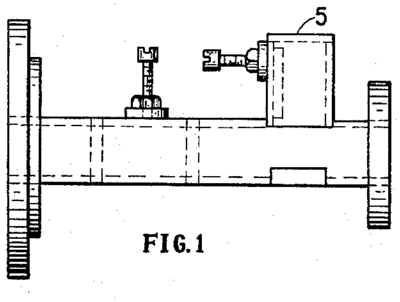
FIG. 1 is a schematic representation of an embodiment of the invention.
Figure 2:
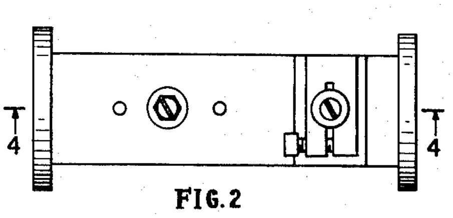
FIG. 2 is a schematic representation of another embodiment of the invention.

Using a slide-screw tuner and a section of waveguide approximately fifteen guide wave lengths long connecting the tuner to the klystron a position and depth of the screw can be found that will linearize the klystron and result in the curve $S_0$ of FIG. 1. This method is described in U.S. Patent 2,747,163.

Figure 5:
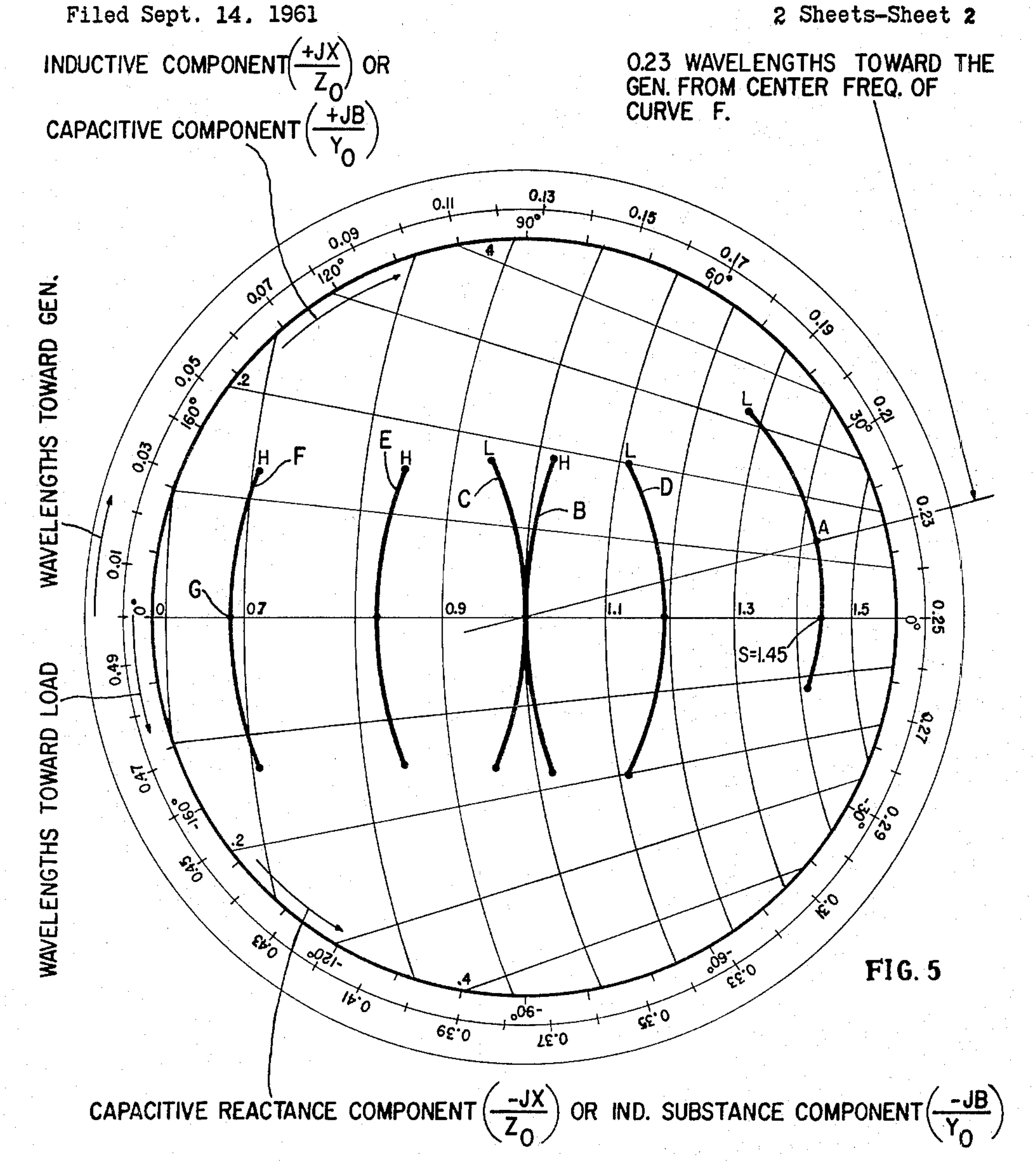

According to the principles of the present invention, the principles of said patent may be used to establish a plot of admittance which might as a typical example, be curve A shown on the Smith Chart in FIG. 5. This curve represents the admittance characteristic necessary to linearize the klystron.

Further according to the principles of this invention a device having an admittance that will duplicate that represented by plot A may be obtained. A tunable filter cavity 1 of FIG. 4, with the required loaded "Q" and having an admittance characteristic B, of FIG. 5 is chosen. This admittance is then referred through a quarter-wave section of waveguide 2, giving admittance characteristic C. This admittance is then transformed through a quarter-wave transformer 3, having a plunger 4, that may be moved to effectively change the transformation ratio. This results in curves D at the filter side of the transformer 3, curve E at the input side of the transformer and curve F at a point just before the transformer on the input side. Curve F may now be rotated toward the generator by referring the admittance through a length of waveguide F'A' of FIG. 4 thus duplicating curve A and the admittance necessary to linearize the klystron. The length of wave guide A'F' necessary to rotate curve F of FIG. 5 to curve A is determined from the Smith Chart and in this case would be .23 wavelength toward the generator from the center frequency point G of curve F which is a zero susceptance point.

The transformation ratio required of transformer 3, to duplicate curve A may be determined as follows. Let $Y_0$ represent the admittance of the waveguide and be equal to one ($Y_0=1$). Then let $Y_0'$ represent the admittance of the transformer and be equal to $1/K$, ($Y_0'=1/K$).

Figure 4:
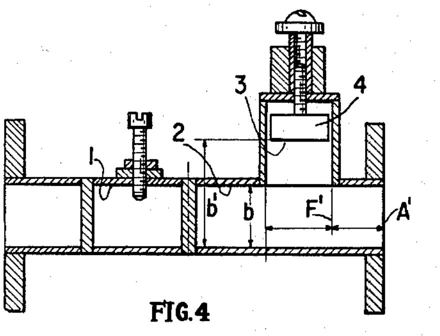
FIG. 4 is a sectional view taken generally along line 4—4 of FIG. 2.

Since the characteristic admittance of a waveguide is inversely proportional to the guide height, K is the ratio of the quarter-wave transformer height, $b'$ FIG. 4, to the standard guide height $b$, ($K=b'/b$).

The capacitance effects at the steps of the quarter-wave transformer may be neglected and the quarter-wave transformation T, is:

$$T\left(\frac{Y_0'}{Y_0}\right)^2=\left(\frac{1}{K}\right)^2$$

The admittance at the center frequency point G, of plot F may be set equal to the reciprocal of the standing wave ratio S at plot A or $1/S$. Thus:

$$\frac{1}{S}=\left(\frac{1}{K}\right)^2$$

and $$K=\sqrt{S}=\frac{b'}{b}$$

In this case since $S=1.45$. $K$ equals 1.20 and $1/K=.832$. Thus, the transformer guide height $b'$, must be K times the standard guide height $b$.

Working from the desired plot at the klystron flange and constructing the other plots as described above, the required loaded Q of the tunable filter cavity may be determined. Due to the extremely tight coupling between the transformer and the filter of the present invention compared to the loose coupling of the previous invention where the reflecting element and the klystron were separated by many filter wavelengths, the transformer is made variable. A simple cylindrical rod was found to be a very satisfactory plunger for the transformer over a ten percent frequency range at 6K mc.

Figure 3:
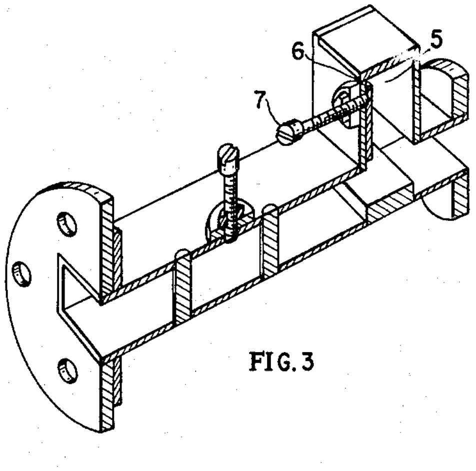
FIG. 3 is a schematic representation showing a sectional perspective view of the embodiment shown in FIG. 1.

FIGS. 1 and 3 are views of an embodiment of the invention which include a modified type of transformer 5, having a plunger 6. This plunger may be moved by means of the screw 7 thus effectively changing the transformation ratio.

Figure 7:
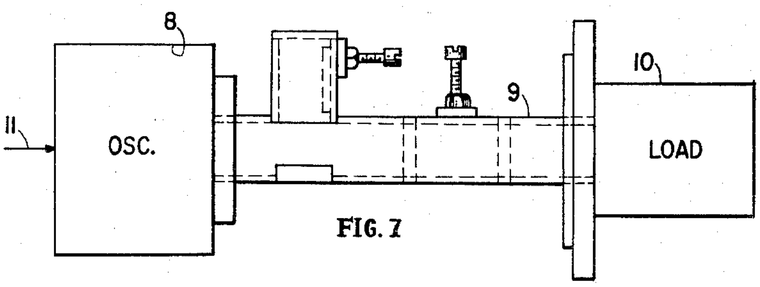
FIGS. 5 and 6 are graphical representations useful in explaining this invention and FIG. 7 is a schematic representation of a frequency modulation system.

FIG. 7 shows how the oscillator 8, having a modulation input 11 operates with the linearizer 9, and the load 10. Note that in FIGURE 7 the linearizer 9 has been rotated from the position shown in FIGURES 1 and 3 so as to permit illustration of the oscillator 8 operating left to right into the load 10.

Though this invention has been described with reference to a specific embodiment, it must be understood that other embodiments are possible and this patent is not limited by description.

What is claimed is:

1. In a frequency modulation system of the type comprising a reflex oscillator having a repeller voltage versus oscillator frequency characteristic for matched impedance operating conditions which departs from linearity over the operating range of said oscillator, means for frequency modulating said oscillator by varying said repeller voltage, a load, and a linearizer device interposed between and coupling said oscillator to said load,
   the improvement that said linearizer device includes resonant means coupled to said load for reflecting energy to said oscillator over said operating range as a predetermined function of frequency to counteract said non-linear characteristic, a transmission line coupling said resonant means to said oscillator, and impedance transforming means in said transmission line to present said reflected energy to said oscillator so as to substantially compensate for the departure from linearity of said characteristic.

2. An improved linearizer device as claimed in claim 1, wherein said resonant means comprises a resonant filter cavity.

3. An improved linearizer device as claimed in claim 2, wherein said resonant filter cavity includes a section of transmission line, inductive reactance means mounted at each end of said section, and capacitance tuning means movably engaging said section and interposed between said inductive reactance means for tuning said filter cavity.

4. An improved linearizer device as claimed in claim 1 wherein said impedance transforming means comprises a quarter-wavelength section of transmission line, and variable attenuator means in said quarter-wavelength section for varying the impedance of said section.

References Cited by the Examiner

UNITED STATES PATENTS

| | | | |
|---|---|---|---|
| 2,708,222 | 5/55 | Herlin | 333—35 |
| 2,900,610 | 8/59 | Allen et al. | 333—35 |

ROY LAKE, *Primary Examiner.*

JOHN KOMINSKI, *Examiner.*